United States Patent [19]

Viallevieille

[11] Patent Number: 4,747,113

[45] Date of Patent: May 24, 1988

[54] PROCESS FOR THE BASE BAND MODULATION OF A DATA SIGNAL, AS WELL AS THE CORRESPONDING MODULATION AND DEMODULATION APPARATUSES

[75] Inventor: Alain Viallevieille, Versailles, France

[73] Assignee: Establissement Public Telediffusion de France, France

[21] Appl. No.: 892,829

[22] Filed: Aug. 1, 1986

[30] Foreign Application Priority Data

Aug. 2, 1985 [FR] France ............... 85-11864

[51] Int. Cl.$^4$ .............................. H03M 7/00
[52] U.S. Cl. ...................... 375/25; 360/44; 340/347 DD
[58] Field of Search ........... 340/347 DD; 360/40, 360/44, 48; 375/25, 27, 110; 332/9 R

[56] References Cited

U.S. PATENT DOCUMENTS

| Re. 27,812 | 11/1973 | Lipp .................... 360/44 |
| 3,377,583 | 4/1968 | Sims, Jr. ............... 360/44 |
| 4,410,877 | 10/1983 | Carasso et al. ........ 360/44 |
| 4,428,007 | 1/1984 | Tanaka et al. ........ 360/44 |
| 4,672,363 | 6/1987 | Tanaka et al. ....... 340/347 DD |

FOREIGN PATENT DOCUMENTS

0013990 1/1980 European Pat. Off.
2853559 6/1979 Fed. Rep. of Germany.
2438388 10/1979 France.
2438391 10/1979 France.
2067055 12/1980 United Kingdom.
2078060 6/1981 United Kingdom.

OTHER PUBLICATIONS

Journal of The Audio Engineering Society, vol. 31, No. 4, Apr. 1983.
IBM Journal of Research and Development, vol. 19, No. 4, Jul. 1975.
IEEE Transitions on Communications, vol. Com-31, No. 1, Jan. 1983.

Primary Examiner—Benedict V. Safourek
Attorney, Agent, or Firm—Cesari and McKenna

[57] ABSTRACT

A process for the base band modulation of a data signal on a magnetic support is characterized in that: (a) a bit value of 0 is marked if it follows an unmarked bit of value of 0 or a sequence of three consecutive unmarked bits of value 1; (b) a bit value 1 as marked if it follows a bit value 0 or a sequence of three consecutive unmarked bits of value 1, except if these rules (a) and (b) lead to marking the first bit of a sequence formed from three bits of value 1 followed by a bit of value 0. The minimum interfront in the modulated signal is equal to 1.5 T and the maximum interfront is equal to 4 T.

9 Claims, 7 Drawing Sheets

PROCESS FOR THE BASE BAND MODULATION OF A DATA SIGNAL, AS WELL AS THE CORRESPONDING MODULATION AND DEMODULATION APPARATUSES

BACKGROUND OF THE INVENTION

The present invention relates to a process for the base band modulation of a data signal, as well as to the corresponding modulation apparatus and demodulation apparatus. It more particularly applies to the recording and magnetic reproduction of digital data, e.g. audio signals.

The process according to the invention is based on a (1.2) modulation, i.e. two binary values are made to correspond to an initial binary value. This modulation is of the 3PM type, which converts any sequence of n data bits into a sequence of 2.n coded bits, each represented by the presence or absence of a transition and in which two consecutive coded bits represented by a transition are separated by at least two coded bits represented by an absence of transition. In other words, if the data signal is presented to a modulator at rate T, the minimum interfront in the modulated signal is equal to 1.5T.

Several modulation processes of the 3PM type are known. From the historical standpoint, the first of these was described in the article "A new look ahead code for increased data density" by G. V. Jacoby, published in IEEE Transactions on Magnetics, Vol mag 13, No 5, September 1977, pp 1202–1204. In this modulation process, the maximum interfront (parameter an indication on the possibility during demodulation of recovering the clock signal from the modulated signal) which is received is 6T. This value is high and constitutes one of the major disadvantages of this modulation process.

Modulation processes of the 3PM type are known in which the maximum interfront is not as high. In the so-called HDM1 modulation process (HDM=high density modulation), the maximum interfront is equal to 4.5T. This interfront still starts in the modulated signal by a transition at the start of the bit interval and still finishes by a transition in the middle of the bit interval. A bit interval has a length T and is associated with a binary data item to be coded. The presence of a transition for representing the first coded bit of this binary data item corresponds to a transition at the start of the bit interval. The presence of a transition for representing the second coded bit corresponds to a transition in the middle of the bit interval. Two consecutive transitions separated by a maximum interfront, each having a fixed position (start or middle) in a bit interval, so that the detection of a sequence comprising a maximum interfront makes it possible to synchronize the clock of period T, deduced from the modulated signal, on the start of the bit intervals. However, this modulation process suffers from the disadvantage that such a sequence is rare. Thus, the synchronization of the clock cannot be checked as often as would be wished.

A type 3PM modulation process is also known, in which the maximum interfront is equal to 4T and this process is called HDM2. In this process, the maximum interfront still starts by a transition in the middle of the bit interval and terminates in the same way. However, the HDM2 process has the disadvantage of not producing a simple correspondence between a sequence of coded bits and a sequence of data bits. For example, a sequence comprising an interfront of length 3T, whose initial transition takes place at the start of the bit interval can correspond both to a sequence of three data bits of value 1 and to a sequence of three data bits of value 0. Thus, the choice between these two possibilities can only take place as a function of the context, i.e. as a function of the bits following said sequence. Thus, demodulation requires a large memory, which makes the demodulation apparatus complicated.

SUMMARY OF THE INVENTION

The present invention relates to a modulation process obviating this disadvantage without any deterioration to the other modulation characteristics, such as the maximum interfront, the minimum interfront of the phase margin. The modulation process according to the invention is of interest in that each pair of two successive transitions of the modulated signal is decodable into a single sequence of consecutive data bits. This makes it possible to reduce the size of the memory required for demodulation compared with the HDM2 modulation process.

More specifically, the invention consists of producing a modulated signal incorporating a sequence of bit intervals at a rate T from a data signal formed from a succession of bits at rate T by a modulation process in which a data bit of a first logic state, designated 0, is marked by a transition at the start of a bit interval and a data bit of the second logic state, designated 1, by a transition in the center of a bit interval and wherein:

(a) a bit is marked with the value 0 if it follows a bit not marked with the value 0 or a sequence of three consecutive bits not marked with the value 1, (b) a bit is marked with the value 1, if it follows a bit of value 0 or a sequence of three consecutive bits not marked with the value 1, (c) by exception to the above rules, in the case where they lead to the marking of the of the first bit of a sequence, called particular sequence, formed from three bits of value 1, followed by a bit of value 0, said particular sequence is coded in the following way:

(c1) if the bit preceding said particular sequences is a marked bit of value 0, only the third bit of value 1 of said particular sequence is marked, by a bit interval centre transition, (c2) in the other cases, the first bit of value 1 is marked, as is the bit of value 0 of said particular sequence, each by a bit interval start transition.

The invention also relates to a modulation apparatus comprising a clock generator supplying a clock signal H of period T, whose rising fronts coincide with the start of the bit intervals of the modulated signal and a clock signal H' of period T/2 synchronized with the clock signal H; a converter supplied by the binary data signal and receiving the clock signal H, said converter supplying two binary signals $d_0$, and $d_1$ respectively designating the transitions at the start and center of the bit interval; and a serialization circuit receiving the signals $d_0$, $d_1$ and the clock signals H and H' and supplying the modulated signal, wherein the converter comprises:

an elementary converter comprising a detection means for detecting and differentiating the marked and unmarked bits of value 0 and a coding means for coding the bit of the data signal following a bit of value 0 detected by the detection means, said coding means being able to code said bit according to the process, a transformation circuit for transforming the value of a bit of value 1 into value 0, prior to the coding of said bit, when one of the following conditions is satisfied:

(a) said bit is the fourth bit of a sequence of four bits of value 1, whereof only the first is marked,
(b) said bit is the second bit of the particular sequence and said sequence follows a marked bit of value 0,
(c) said bit is the third bit of the particular sequence and said sequence follows an unmarked bit of value 0.

Finally, the invention relates to a demodulation apparatus for demodulating a signal obtained by the process according to the invention.

This demodulation apparatus comprises a clock restoration circuit receiving the modulated signal and producing a clock signal H of period T, whose rising fronts coincide with the start of the bit intervals and a clock signal H' of period T/2 synchronized with the clock signal H; a deserialization circuit receiving the clock signal H' and the modulated signal and supplying a sign $S_0$ indicating the presence of a transition at the start of a bit interval and a signal $S_1$ indication a transition in the center of a bit interval; and a converter receiving the signals supplied by the deserialization circuit and the clock signal H and producing a binary data signal, wherein the converter comprises:

an elementary converter for supplying a data bit of value 0, when the signal $S_0$ indicates a transition at the start of a bit interval and a data bit of value 1 when the signal $S_1$ indicates a transition in the centre of the bit interval and for setting to the value 0 each data bit preceding a marked bit, a transformation circuit for transforming the state of a data bit of value 0 supplied by the elementary converter into a data bit of value of value 1 when one of the following conditions is satisfied:

($\alpha$) in a modulated signal, whereof the interfront is equal to 3.5T or 4T, in which said bit precedes the bit associated with the final transition of the interfront and the initial transition of the interfront is in the center of the bit interval, said bit is set to the value 1, ($\beta$) in a modulated signal, whereof the interfront is equal to 3T and whereof the initial transition is at the start of the bit interval, the three bits associated with said interfront are set to value 1, ($\gamma$) in a modulated signal, whereof the interfront is equal to 3.5T and whereof the initial transition is at the start of the bit interval, the two bits associated with the consecutive bit intervals with respect to said bit interval are set to the value 1.

BRIEF DESCRIPTION OF THE DRAWINGS

The invention is described in greater detail hereinafter relative to non-limitative embodiments and with reference to the attached drawings, wherein show.

DETAILED DESCRIPTION OF THE PREFERRED EMBODIMENTS

A description will now be given of the modulation process according to the invention relative to FIGS. 1a to 1i, each of which comprises a binary data sequence or string and the corresponding modulated signal. Each sequence or string has two consecutive parts.

Figure 1A:
FIGS. 1a to 1i, the modulation rules according to the process of the invention.
Figure 1B:
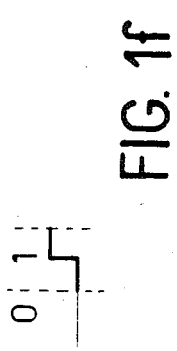
Figure 1C:
Figure 1D:
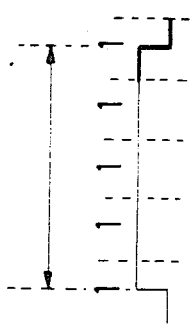
Figure 1E:
Figure 1F:
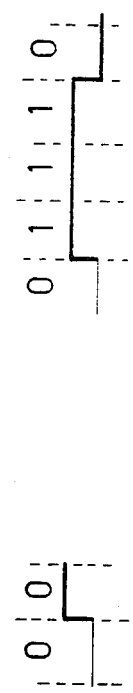
Figure 1G:
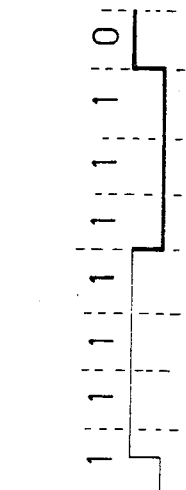
Figure 1H:
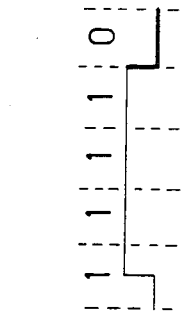
Figure 1I:
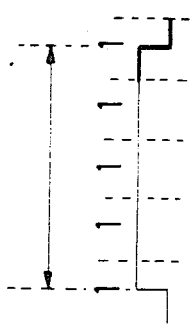

In FIGS. 1a, 1b and 1c, the first part is a marked bit of value 0, while in FIGS. 1d, 1e and 1f, it is an unmarked bit of value 0 and in FIGS. 1g, 1h and 1i it is a string formed from four bits of value 1, whereof only the first is marked. The second part is a bit of value 0 in FIGS. 1a, 1d and 1g, a string formed from three bits of value 1 and one bit of value 0 in FIGS. 1b, 1e and 1h and a string of four bits starting by a bit of value 1, but differing from the preceding string in FIGS. 1c, 1f and 1i.

It is pointed out that the coding rules are as follows.

(a) a bit of value 0 is marked if it follows an unmarked bit of value 0 or a sequence of three consecutive unmarked bits of value 1. These two cases are respectively illustrated by FIGS. 1d and 1g. In the opposite case, where the bit of value 0 follows a marked bit of value 0 and is consequently not marked is illustrated by FIG. 1a.

(b) a bit of value 1 is marked if it follows a bit of value 0 or a sequence of three consecutive unmarked bits of value 1. The first case corresponds to FIGS. 1c and 1f respectively when the bit of value 0 is marked and when it is not marked. The second case is represented in FIG. 1i showing the maximum interfront of length 4T, (c) in the case where rules (a) and (b) lead to the marking of the first bit of a sequence, called particular sequence and formed from three bits of value 1 followed by a bit of value 0, said particular sequence undergoes block coding, by exception to the two above rules (a) and (b) in the following way:

(c1) if the bit preceding said particular sequence is a marked bit of value 0, only the third bit of value 1 of said particular sequence is marked and this is done by a transition in the center of the bit interval and is illustrated by FIG. 1b.

(c2) in other cases, the first bit of value 1 and the bit of value 0 of said particular sequence is in each case marked by a transition at the start of the bit interval.

This case is shown in FIGS. 1e and 1h respectively when said particular sequence is preceded by an unmarked bit of value 0 and when said particular sequence is preceded by a string of three unmarked consecutive bits of value 1. Case (c2) is the only one in which a bit of value 1 is marked by a transition at the start of the bit interval.

The modulated signal obtained according to the modulation process according to the invention has a simple correspondence with the data signal, unlike in the case of the modulated signal obtained by the known HDM2 modulation process. Thus, as shown in FIGS. 2a and 2f, the knowledge of the distance between two consecutive transitions and of the position of the first of these transitions (start or center of the bit interval, unambiguously determines a string of data bits.

Figure 2:
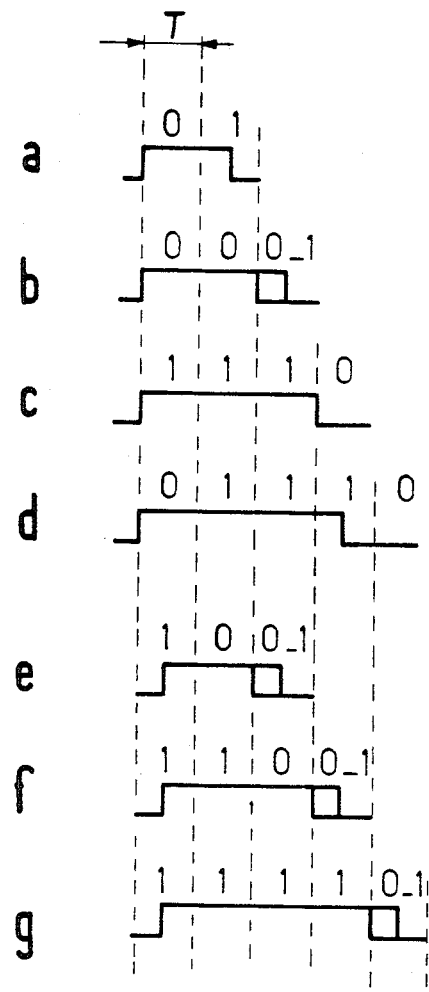
FIG. 2, shows that each transition pair spaced by a length between 1.5 and 4T and whose initial transition has a given position (start or center of bit interval) univocally defines a sequence of data bits.

In FIGS. 2a, 2b, 2c and 2d, the first transition is at the start of the bit interval. In FIGS. 2e, 2f and 2g it is in the center of the bit interval. FIG. 2c, where the distance between the transitions is equal to 3T corresponds to the particular sequence of three consecutive bits of value 1 followed by a bit of value 0 coded according to rule (c2).

FIG. 2a illustrates the case where the interval between two consecutive transitions is equal to 1.5T, FIG. 2b cases 2T and 2.T, FIG. 2d case 3.5T, FIG. 2e cases 1.5T and 2T, FIG. 2f cases 2.5T and 3T and FIG. 2g cases 3.5T and 4T.

Figure 3:
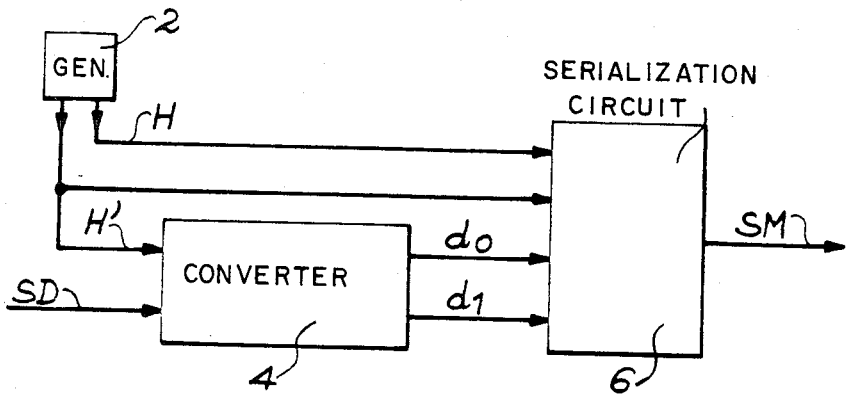
FIG. 3, the structure of the modulation apparatus according to the invention.

FIG. 3 diagrammatically shows a modulation apparatus for performing the modulation process according to the invention. This apparatus comprises a clock generator 2, a converter 4 and a serialization circuit 6. Clock generator 2 produces a clock signal H of period T and a clock signal H' of period T/2, said two signals being synchronized with one another and with the data signal SD to be coded. The latter is applied to one input of converter 4, which also receives the clock signal H'. It supplies two signals $d_0$ and $d_1$ respectively indicating the presence or absence of a transition at the start and center of a bit interval as a function of the data bit to be coded and optionally preceding data bits. Signals $d_0$ and $d_1$ and the clock signals H and H' are applied to the inputs of the serialization circuit 6, which supplies the modulated signal SM corresponding to the data signal received by converter 4.

Converter 4 is formed from two components, namely an elementary converter and a transformation circuit. The elementary converter is designed to detect and differentiate the marked and unmarked bits of value 0 and for coding the bit following said detected bit. In certain cases, the transformation circuit sets to 0 the value of a bit of value 1 prior to the coding of said bit. This enables the elementary converter to bring about an overall coding of the data signal.

Figure 4:
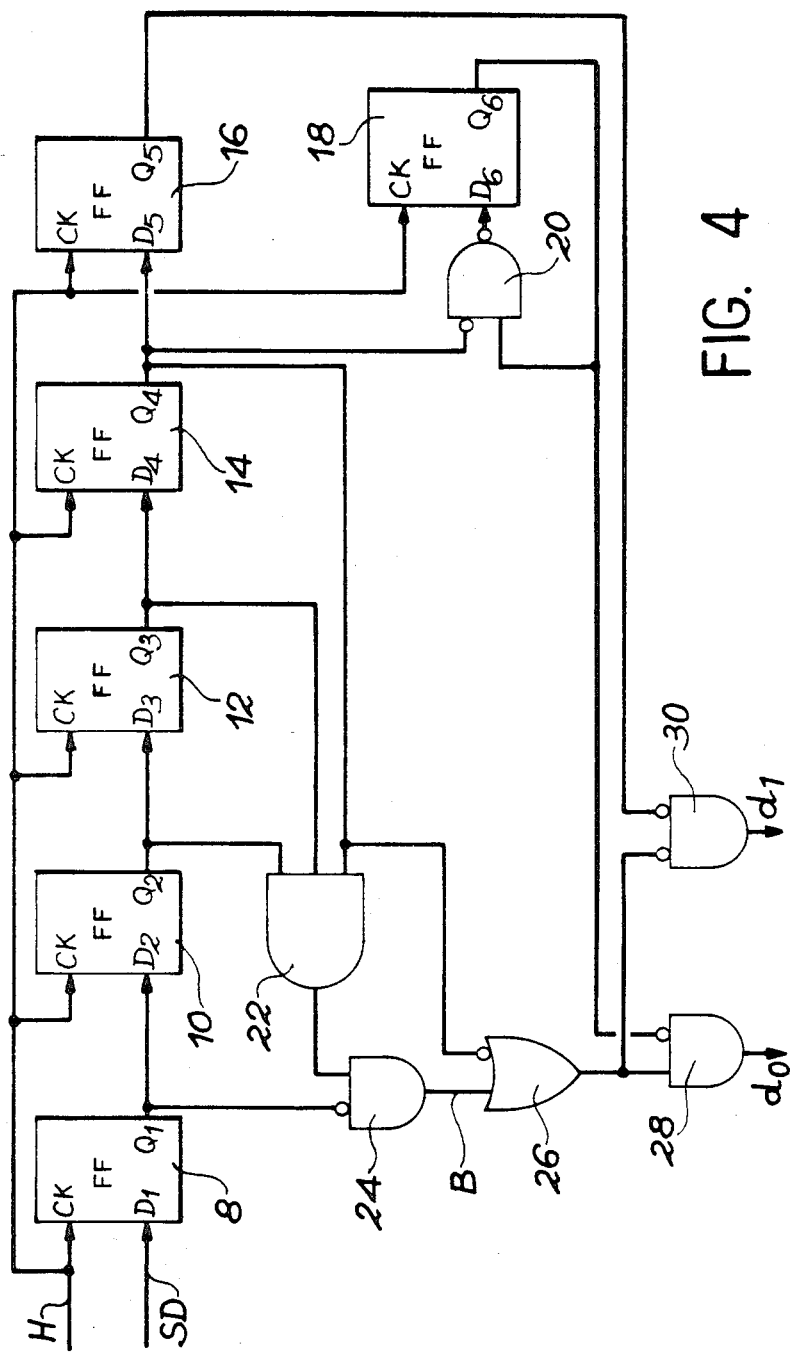
FIG. 4, an embodiment of the elementary converter of the converter of the modulation apparatus according to the invention.

An embodiment of the elementary converter is shown in FIG. 4. It comprises five type D flip-flops 8, 10, 12, 14 and 16 forming a shift register. The data inputs and outputs of these flip-flops are respectively designated $D_i$ and $Q_i$, in which $1 \leq i \leq 5$ is the rank or order of the flip-flops. The elementary converter also comprises a type D flip-flop 18, the data input and output thereof being respectively designated $D_6$ and $Q_6$. Each flip-flop receives the clock signal H at its clock input CK. The bit being coded is the bit present at $Q_4$.

Finally, the elementary converter comprises a group of logic gates, namely a NAND gate 20, whereof an inverting input is connected to output $Q_4$ and a non-inverting input to output $Q_6$ and whereof the output is connected to input $D_6$; an AND gate 22 with three inputs connected to outputs $Q_2$, $Q_3$ and $Q_4$; an AND gate 24, whereof an inverting input is connected to output $Q_1$ and a non-inverting input to the output of AND gate 22; an OR gate 26, whereof an inverting input is connected to output $Q_4$ and a non-inverting input to the output of AND gate 24; an AND gate 28, whereof an inverting input is connected to output $Q_6$ and a non-inverting input to the output of the OR gate 26; and an AND gate 30 with inverting inputs connected to output $Q_5$ and to the output of the OR gate 26. Gates 28 and 30 supply signals $d_0$ and $d_1$ indicating the presence or absence of a transition respectively at the start or center of the bit interval for the bit being coded.

The detection and differentiation means is constituted by elements 16, 18 and 20. The detection of bits of value 0 is ensured by flip-flop 16. The presence of a 0 at $Q_5$ is indicated by the low state of said output $Q_5$. The differentiation of the bits of value 0 takes place by a counting circuit formed by flip-flop 18 and the NAND gate 20. Thus, the marked bits of value 0 are value 0 bits of even rank or order. Output $Q_6$ can have two values $Q_6=0$ indicating the presence of an unmarked bit of value 0 at $Q_5$ (0=uneven rank, giving $Q_5=0$), $Q_6=1$ indicating the presence of a marked 0 if $Q_5=0$ (0 of even rank).

The detection of sequences 1110 on having a marked or unmarked bit of value 0 at $Q_5$ is ensured by gates 22 and 24 considering outputs $Q_1$ to $Q_4$ of the shift register. Output signal B of gate 24 is equal to $\overline{Q_1} \cdot Q_2 \cdot Q_3 \cdot Q_4$. It is equal to 1 if the sequence 1110 is detected and to 0 in the opposite case.

Signals $d_0$ and $d_1$ have their state corresponding to the marking or to the absence of marking with respect to the bit present at $Q_4$. They are defined by:

$$d_0 = \overline{Q_6} \cdot (\overline{Q_4} + \overline{Q_1} \cdot Q_2 \cdot Q_3 \cdot Q_4)$$

$$d_1 = \overline{Q_5} \cdot \overline{(Q_4 \cdot \overline{Q_1} \cdot Q_2 \cdot Q_3 \cdot Q_4)} = \overline{Q_5} \cdot \overline{(Q_4 + \overline{Q_1} \cdot Q_2 \cdot Q_3 / Q_4)}$$

The elementary converter makes it possible to code the cases corresponding to FIGS. 1a, 1c, 1d and 1f. The cases of FIGS. 1b and 1e are partly covered, The taking into account of the other modulation rules (FIGS. 1g, 1h, 1i and final transition on FIGS. 1b and 1e) is realized by the elementary converter as a result of the action of the transformation circuit which, prior to the coding of the data bits, sets certain bits of value 1 to value 0.

Figure 5:
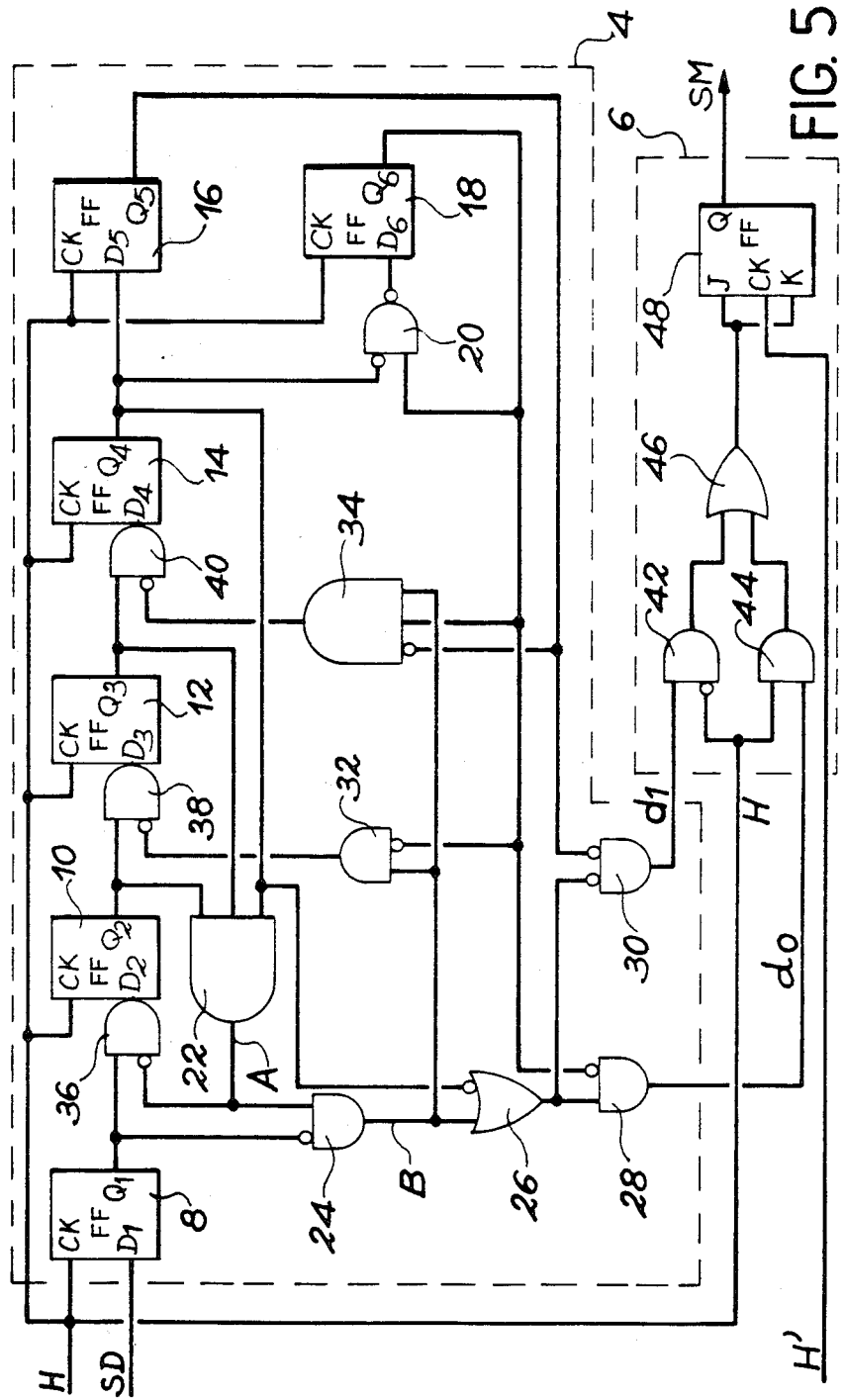
FIG. 5, an embodiment of the converter and the serialization circuit of the modulation apparatus according to the invention.

FIG. 5 shows an embodiment of converter 4 and serialization circuit 6. Said converter comprises an elementary converter identical to that shown in FIG. 4 and a transformation circuit formed from a group of logic gates for setting one of the inputs $d_2$, $d_3$ or $d_4$ at value 0 as a function of the states of outputs $Q_1$ to $Q_6$. This is necessary for marking all the bits which have to be marked because signals $d_0$ and $d_1$ can only pass to the high state when $Q_5$ equals 0.

The value 0 set on one of the inputs $D_2$, $D_3$, or $D_4$ is seen by the elementary converter as an unmarked bit of value 0 at $Q_6$ (it will subsequently be established whether this bit of value 0 still follows a bit of value 1) and the bit which then at $Q_4$ is then marked according to the operating rules of the elementary converter. Particularly if at that instant one has a bit of value 0 at $Q_4$ for the following clock period, said bit of value 0 will be considered as a marked 0.

The transformation circuit is constituted by an AND gate 32, whereof an inverting input is connected to output $Q_6$ and a non-inverting input to the output of AND gate 24; an AND gate 34, whereof an inverting input is connected to output $Q_5$ and two non-inverting inputs to output $Q_6$ and to the output of the AND gate 24; an AND gate 36, whereof an inverting input is connected to the output of AND gate 22 and a non-inverting input to output $Q_1$ and whereof the output is connected to input $D_2$; an AND gate 38, whereof an inverting input is connected to the output of AND gate 32 and a non-inverting input to output $Q_2$ and whereof the output is connected to input $D_3$; and an AND gate 40, whereof an inverting input is connected to the output of AND gate 34 and a non-inverting input to output $Q_3$ and whereof the output is connected to input $Q_4$.

The transformation circuit functions in the following way. When a sequence 1111 appears, we have $Q_1=Q_2=Q_3=Q_4=1$. Output $Q_5$ is equal to 0 (otherwise one of the inputs of the shift register would have been set at value 0). The bit present at $Q_4$ is marked according to the operating rules of the elementary converter ($d_0=0$, $d_1=1$) and input $D_2$ is set to value 0. In the other cases $D_2=Q_1$. When the bit set at value 0 in $D_2$ reaches $Q_5$, it is considered as an unmarked 0 (it follows a 1, i.e. it is a 0 of uneven order). The following bit is then marked by the elementary converter according to its normal operating rules. Thus, the marking of the bits in the case of FIGS. 1g, 1h and 1i amounts to the marking of the bits in the case of FIGS. 1d, 1e and 1f.

From the practical standpoint, we obtain:

$$D_2=Q_1 \cdot \overline{(Q_1 \cdot Q_2 \cdot Q_3 \cdot Q_4)} = Q_1 \cdot \overline{(Q_2 \cdot Q_3 \cdot Q_4)}$$

Thus, the final transition has to be ensured for the cases of FIGS. 1b and 1e.

During the appearance of the sequence 1110 following an unmarked bit of value 0 (FIG. 1e), we have $Q_6=0$ and $Q_1=0$, $Q_2=Q_3=Q_4=1$. The bit is marked at $Q_4$ according to the operating rules of the elementary converter and input $D_3$ is set to value 0, while in the other cases $D_3=Q_2$.

When this bit set at value 0 arrives at $Q_5$, it is considered as an unmarked bit of value 0 because it follows a bit of value 1 (i.e. a bit of value 0 of uneven order). The bit of value 0 of sequence 1110 is then marked by the elementary converter by a transmission at the start of the bit interval ($d_0=1$, $d_1=0$) and is then considered as a marked bit of value 0. The state of input $D_3$ is such that:

$$D_3=Q_2 \cdot \overline{(Q_1 \cdot Q_2 \cdot Q_3 \cdot Q_4 \cdot \overline{Q_6})}$$

During the appearance of the sequence 1110 following a marked bit of value 0 (FIG. 1b), we obtain:

$$Q_6=1, Q_5=0, Q_1=0, Q_2=Q_3=Q_4=1.$$

The bit at $Q_4$ is not marked (normal rules) and input $D_4$ is set to value 0 and in the other cases we have $D_4=Q_3$.

When this bit set at value 0 arrives at $Q_5$, it is considered as an unmarked bit of value 0 because it follows a bit of value 1. The final bit of value 1 of sequence 1110 is then marked by a phase jump in the centre of the bit interval by the elementary converter ($d_0=0$, $d_1=1$). The bit of value 0 of this sequence is then considered as an unmarked bit of value 0. The state of $D_4$ is such that:

$$D_4=Q_3 \cdot \overline{(Q_1 \cdot Q_2 \cdot Q_3 \cdot Q_4 \cdot \overline{Q_5} \cdot Q_6)}$$

In summarizing, the operation of the converter is defined on the basis of outputs $Q_1$, $Q_2$, $Q_3$, $Q_4$, $Q_5$ and the counting input $Q_6$ of the bits of value 0 by the following logic equations:

$$d_0=\overline{(\overline{Q_1 \cdot Q_2 \cdot Q_3 \cdot Q_4} + \overline{Q_4})} \cdot \overline{Q_6} = \overline{(B+Q_4)} \cdot Q_6$$

$$d_1=\overline{(\overline{Q_1 \cdot Q_2 \cdot Q_3 \cdot Q_4} \cdot Q_4)} \cdot \overline{Q_5} = \overline{(B+Q_4)} \cdot Q_5$$

$$D_2=Q_1 \cdot \overline{(Q_2 \cdot Q_3 \cdot Q_4)} = Q_1 \cdot \overline{A}$$

$$D_3=Q_2 \cdot \overline{(Q_1 \cdot Q_2 \cdot Q_3 \cdot Q_4 \cdot \overline{Q_6})} = Q_2 \cdot \overline{(B \cdot \overline{Q_6})}$$

$$D_4=Q_3 \cdot \overline{(Q_1 \cdot Q_2 \cdot Q_3 \cdot Q_4 \cdot \overline{Q_5} \cdot Q_6)} = Q_3 \cdot \overline{(B \cdot \overline{Q_5} \cdot Q_6)}$$

with $A=Q_2 \cdot Q_3 \cdot Q_4$ and $B=\overline{Q_1} \cdot A$

The modulated signal is processed by the serialization circuit 6 from signals $d_0$ and $d_1$ and clock signals H and H'. In the embodiment of FIG. 5, said, serialization circuit comprises an AND gate 42, whereof a non-inverting input receive signal $d_1$ and an inverting input the clock signal H; an AND gate 44, whereof the inputs receive the signals $d_0$ and H; an OR gate 46 whereof the inputs are connected to the outputs of the AND gates 42 and 44; and a type J-K flip-flop 48 receiving on its inputs J and K, the signal supplied by the OR gate 46 and on its clock input CK, the clock signal H'. The modulated signal is supplied by the data output Q of flip-flop 48.

The aforementioned converter permits the emission of a data signal modulated according to the process of the invention. It is often useful to be able to add to the data of the modulated signals particular words, such as frame synchronization words, so as to easily mark, on reception, the precise times in the bit stream received. As shown by FIGS. 2a to 2g, the maximum distance between two consecutive transitions, which is equal to 4T, only intervenes between transitions located in the center of a bit interval. This makes it possible to identify the start and center of these bit intervals. It is therefore possible to represent a synchronization word by a distance between transitions equal to 4T, said transitions intervening at the start of a bit interval. It is also possible to represent this synchronization word by any distance between transitions exceeding 4T.

For the simplicity of the insertion and utilization circuits of the synchronization word, it is advantageous to use a synchronization word having a distance between two transitions in the center of the bit interval equal to 5T.

One realization consists of simultaneously introducing an 8 bit word on the data input of the converter and a synchronization information SY on a sychronization input. This 8 bit word must make it possible to establish the presence of transitions at the same point, no matter under what context it arrives. This makes it necessary for it to start and finish with a bit of value 0. These bits of value 0 surround six consecutive bit of value 1.

Signal SY is supplied to the synchronization input and prevents the change of state which, according to the modulation rules, would normally have taken place on the fifth bit of value 1 of the sequence.

Figure 6:
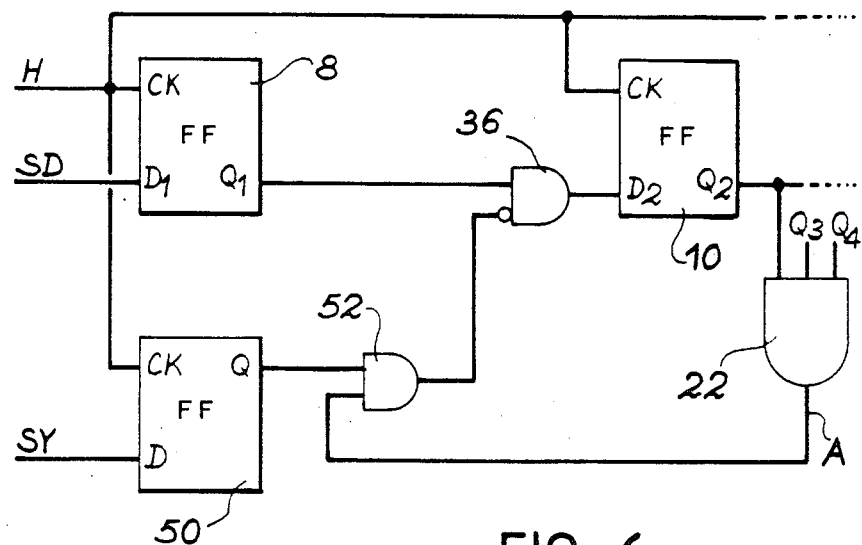
FIG. 6, a means for inserting a synchronization word, which can be added to the modulation apparatus according to the invention.

An embodiment of this synchronization word insertion means is shown in FIG. 6 relative to elements 8, 10, 22 and 36 of the elementary converter. This insertion means comprises a type D flip-flop 50, whose data input D receives the synchronization signal SY and the clock input the clock signal H, an AND gate 52, whose inputs are connected to the data output Q of flip-flop 50 and to the output of AND gate 22 and whereof the output is connected to the inverting input of AND gate 36.

Figure 7:
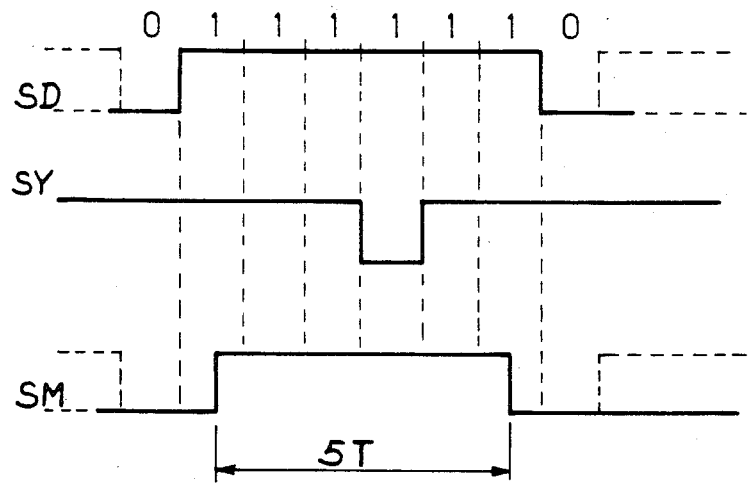
FIG. 7, a timing chart for the main signals associated with the circuit of FIG. 6.

The timing chart of FIG. 7 shows the data signal SD applied to input $D_1$. This signal represents the synchronization word 01111110 in NRZ (non return to zero) modulation. The modulated signal SM supplied by the serialization circuit is represented in correspondence. It comprises two transitions in the center of the bit intervals of the first and last bits of value 1 of the synchronization word, said transitions being spaced by 5T. The synchronization signal SY prevents the appearance of a transition on the fifth bit of value 1 of the synchronization word. This synchronization signal is introduced by a control means upstream of the converter at the same time as the synchronization word is applied to the data input of the converter.

Figure 8:
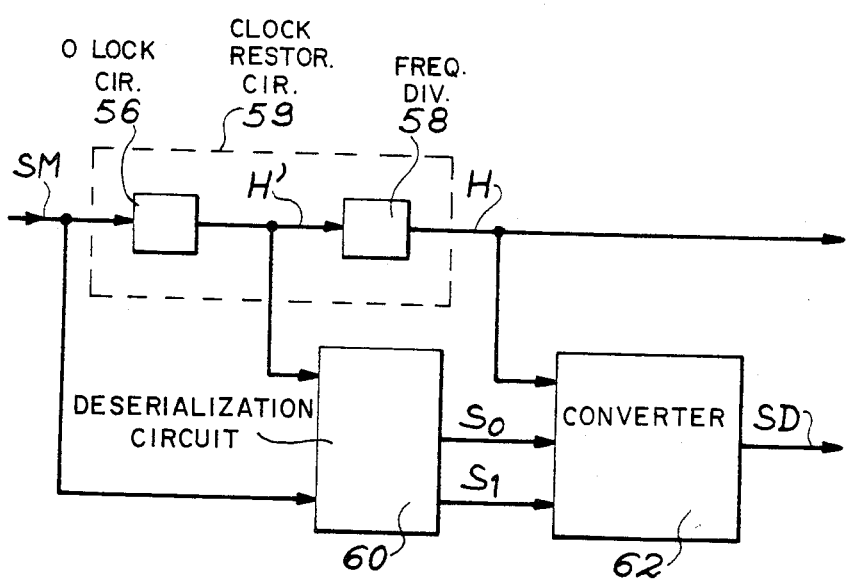
FIG. 8, the structure of the demodulation apparatus according to the invention.

With reference to FIG. 8, a description will now be given of a demodulation apparatus for reproducing the data signal coded on transmission on the basis of the received signal modulated according to the process of the invention. This demodulation apparatus comprises three components, namely a clock restoration circuit 59, a deserialization circuit 60 and a converter 62.

The clock restoration circuit 59 is of the conventional type and produces a clock signal H' of frequency 2/T, which is double the data bit rate on transmission on the basis of the modulated signal SM, by a circuit 56 which can e.g., be a phase lock loop. This clock signal H', whose falling fronts e.g., coincide with the transitions of the modulated signal supplies a freqeuncy divider 58, namely the component of the clock restoration circuit 59 which supplies a clock signal H of frequency 1/T by frequency division of clock signal H'.

In conventional manner, the frequency divider 58 comprises a not-shown control input for permitting a phase inversion of the clock signal H, so that the rising fronts coincide with the start of the bit intervals of the data signal SD. The exact phase of the clock signal H is accurately restored considering the distances between two successive transitions and by detecting the distances equal to 4T (FIG. 1i) or to 5T for the synchronization words. It is known that these fronts are linked with transitions in the center of the bit interval and appear when there are at least five consecutive bits of value 1.

Finally, the demodulation apparatus comprises a deserialization circuit 60, which receives the modulated signal SM and the clock signal H' and which supplies two signals SO and S1 indicating the presence or absence of transitions respectively at the start and center of the bit interval. These two signals are applied with the clock signal H to the inputs of converter 62, which supplies the data signal SD coded on transmission.

Figure 9:
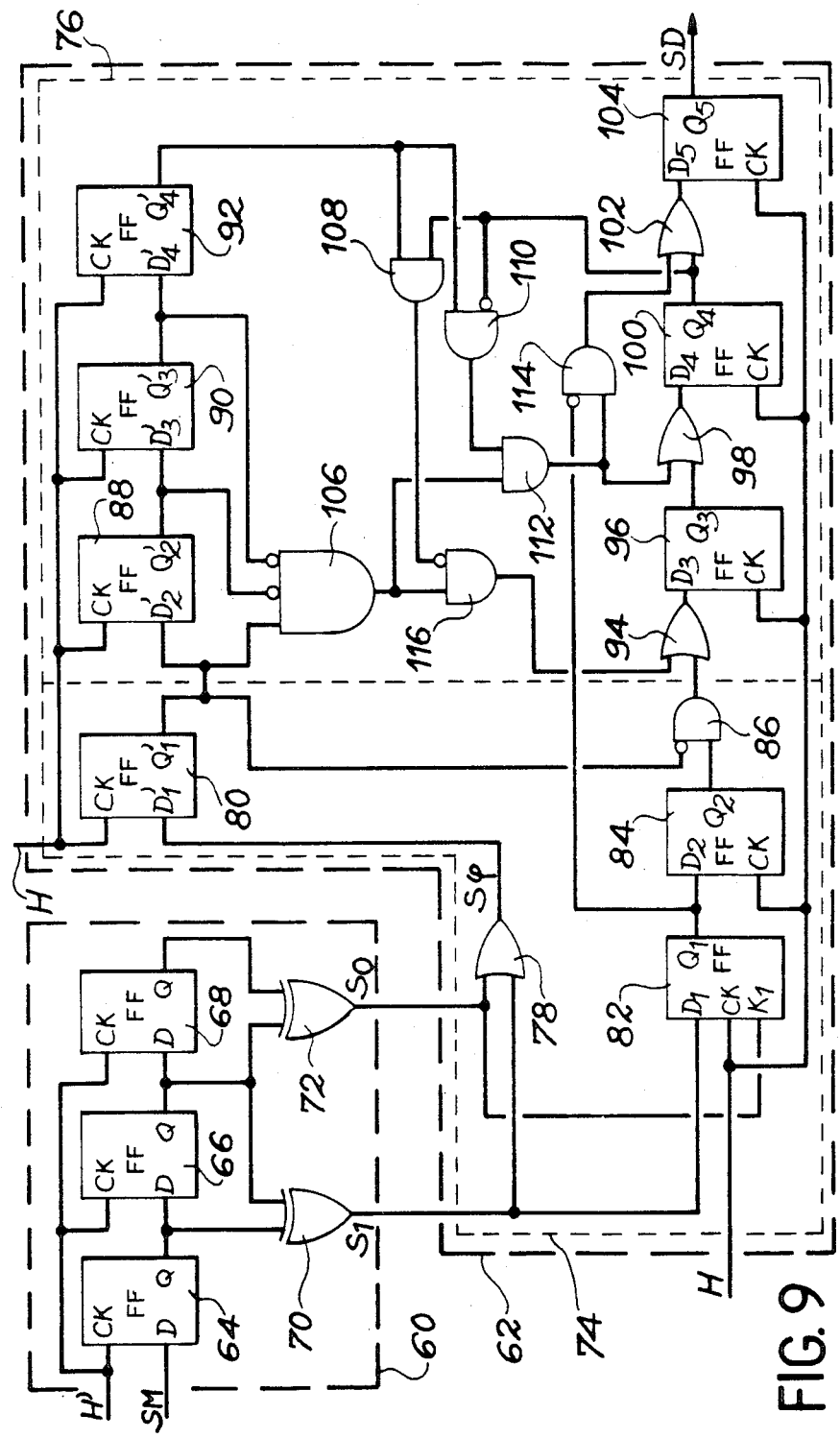
FIG. 9, an embodiment of the deserialization circuit and the converter of the demodulation apparatus according to the invention.

FIG. 9 illustrates an embodiment of the deserialization circuit and of the converter of the demodulation apparatus.

The deserialization circuit 60 comprises three type D flip-flops 64, 66 and 68 timed by the clock signal H' and forming a shift register, an EXCLUSIVE-OR gate 70, whose inputs are connected to the data outputs Q of flip-flops 64 and 66 and an EXCLUSIVE-OR gate 72, whose inputs are connected to the data outputs Q of flip-flops 66, 68. Gates 70 and 72 supply signals $S_1$ and $S_0$ respectively indicating the transitions in the center and start of the bit interval, said signals being associated with clock signal H.

On knowing the position of two successive transitions, the modulation process used makes it possible in all cases to decode the bits between the bit associated with the first transition (included) and the bit associated with the last transition (excluded) (cf FIGS. 2a to 2f). The converter operates by marking the position of the first transition and measuring the distance separating it from the following transition.

Converter 62 is divided into a first part constituted by an elementary converter 71 relating to the position of the transitions in the bit interval and a second part constituted by a circuit 76 for transforming the bit stream passing out of the converter for transforming it as a function of the distance between transitions.

The elementary converter comprises an OR gate 78 receiving signals $S_0$ and $S_1$ and supplying a transition-indicating signal S, a type D flip-flop 80, whose data input $D'_1$ is connected to the output of the OR gate 78, a J-K flip-flop 82, whose inputs $J_1$ and $K_1$ respectively receive the signals $S_1$ and $S_0$, a type D flip-flop 84, whose data input $D_2$ is connected to the data output $Q_1$ of flip-flop 82 and an AND gate 86 having an inverting input connected to output $Q'_1$ and a non-inverting input connected to output $Q_2$, the output of said AND gate 86 constituting the data output of the elementary converter. All the flip-flops are timed by the clock signal H.

Elementary converter 74 functions according to two basic rules:

On having a transition ($S\phi=1$), the bit associated with the transition and the following transitions assumes the value 1 if $S_1=1$ and $S_0=0$ (jump in the middle of the bit interval) and the value 0 if $S_1=0$ and $S_0=1$ (jump in the beginning of the bit interval) and the value of the bit preceding the bit associated with the transition is set to 0. These two rules which describe the operation of the elementary converter do not take account of the decoding of the three particular sequences in all the possible sequences. The elementary converter does not make it possible to decode:

($\alpha$) The sequences of several bits of value 1 of a consecutive nature leading to a distance between transitions of 3.5 or 4T.

($\beta$) The sequences 1110 leading to a distance between transitions of 3T.

($\gamma$) The sequences 1110 leading to a distance between transitions of 3.5T.

These sequences are taken into account by the transformation circuit.

We will now return to the elementary converter, whose operation is as follows. Output $Q'_1$ indicates whether a transition has taken place and output $Q_1$ gives the nature of this transition. We obtain $Q_1=1$ if during the rising front of the clock H there was $S_1=1$ and $S_0=0$ and $Q_1=0$ if during the rising front of the clock H there was $S_1=0$ and $S_0=1$. If the $S_1=S_0=0$, output $Q_1$ does not change state during the state changes of clock H.

The elementary converter also sets the value of the bit preceding the bit associated with the transition to 0, when there is a transition and does not change the value in other cases. Thus, at the output of AND gate 86, we obtain $\overline{Q'_1} \cdot Q_2$.

The transformation circuit 76 making it possible to decode sequences of cases $\alpha$, $\beta$, and $\gamma$ comprises the following components.

A group of three D-type flip-flops 88, 90 and 92 arranged in series and forming a four-stage shift register with flip-flop 80 of the elementary converter. The inputs of these three flip-flops are respectively designated $D'_2$, $D'_3$ and $D'_4$ and the outputs $Q'_2$, $Q'_3$ and $Q'_4$.

Three groups in series each constituted by an OR gate 94, 98, 102 and a type D flip-flop 96, 100, 104. The output of each OR gate is connected to the data input $D_3$, $D_4$, $D_5$ of the associated flip-flop; The outputs $Q_3$ and $Q_4$ of flip-flops 96 and 98 are respectively connected to one input of OR gates 98 and 102; the output of AND gate 86 (elementary converter output) is connected to an input of the OR gate 94; and output $Q_5$ of flip-flop 104 supplies the data signal SD demodulated in NRZ.

A group of logic gates, namely an AND gate 106, whose two inverting inputs are connected to outputs $Q'_2$ and $Q'_3$ and a non-inverting input to the output $Q'_1$; an AND gate 108, whose inputs are connected to outputs $Q_4$ and $Q'_4$; an AND gate 110, whose inverting input is connected to output $Q_4$ and whose non-inverting input is connected to output $Q'_4$; an AND gate 112, whose inputs are connected to the outputs of the AND gates 106 and 110; an AND gate 114, whereof an inverting input is connected to output $Q_1$ and a non-inverting input to the output of AND gate 112; and an AND gate 116, whereof an inverting input is connected to the output of AND gate 106 and a non-inverting input to the output of AND gate 106; the outputs of AND gates 116, 112 and 114 being respectively applied to an input of OR gates 94, 98 and 102.

The transformation circuit sets to the value 1, certain bits of value 0 passing out of the elementary converter during the appearance of the three previously described cases:

($\alpha$) During the appearance of a distance 3.5 or 4T between the front, the value of the bit preceding the final transition is maintained at 1, if the preceding code state change was a transition in the center of the bit interval.

($\beta$) During the appearance of a sequence of length 3T associated with transitions at the start of the bit interval, the three bits associated with the sequence are set to value 1.

($\gamma$) During the appearance of a sequence of length 3.5T associated with a transition at the start of the bit interval for the first bit of the sequence, the second and third bits of the sequence are set at value 1.

The transformation circuit of the bit stream supplied by the elementary converter takes account of the outputs $Q'_1$ to $Q'_4$ and $Q_1$ to $Q_5$ of the different flip-flops. It associates three transformations of the bit stream with the three cases described hereinbefore. It is firstly necessary to identify these three cases and then act on inputs $D_3$, $D_4$ and $D_5$ of the shift register formed by flip-flops 96, 100 and 104.

These cases are identified in the following way:

($\alpha$) A code word of length 3.5 or 4T, whose first transition is in the center of the bit interval corresponds to state $Q'_1=1$ and $Q'_2=Q'_3$, $Q'_4=0$. This condition in itself makes it possible to identify the length increments 3.5 and 4T, whereof the first transition arrives in the center of the bit.

($\beta$) A code word of length 3T, whereof the first transition arrives at the start of the bit interval and corresponds to state $Q'_1=Q'_4=1$, $Q'_2=Q'_3=0$ and $Q_1=Q_4=0$.

($\gamma$) A code word of length 3.5T, whereof the first transition arrives at the start of the bit interval and corresponds to state $Q'_1=Q'_4=1$, $Q'_2=Q'_3=0$, $Q_1=1$ and $Q_4=0$.

Identification having taken place, the modification of the bit stream by setting to value 1 of the inputs $D_3$, $D_4$ and $D_5$ takes place in the following way:

(a) input $D_3$ is equal to 1 if $Q'_1=0$ and $Q_2=1$ (operating condition of the elementary converter). The transformation circuit will set $D_3$ to value 1 in cases ($\alpha$), ($\beta$) and ($\gamma$), described hereinbefore. We then obtain $\overline{Q'_4}\cdot\overline{Q'_3}\cdot\overline{Q'_2}\cdot Q'_1=1$ in the case ($\alpha$) and $\overline{Q'_4}\cdot\overline{Q'_3}\cdot\overline{Q'_2}\cdot Q'_1\cdot\overline{Q_4}=1$ in the cases ($\beta$) and ($\gamma$).

All the conditions are summarized by the logic equation:

$$D_3=\overline{Q'_1}\cdot Q_2+\overline{Q'_4}\cdot\overline{Q'_3}\cdot\overline{Q'_2}\cdot Q'_1+\overline{Q_4}\cdot Q'_4\cdot\overline{Q'_3}\cdot\overline{Q'_2}\cdot Q'_1$$

$$D_3=\overline{Q'_1}\cdot Q_2+\overline{Q'_4}\cdot\overline{Q'_3}\cdot\overline{Q'_2}\cdot Q'_1+\overline{Q_4}\cdot\overline{Q'_3}\cdot\overline{Q'_2}\cdot Q'_1$$

(b) Input $D_4$ of the converter assumes the value $Q_3$ in the general case. The transformation circuit sets $D_4$ to value 1 in cases ($\beta$) and ($\gamma$), i.e. when: $Q'_4\cdot\overline{Q'_3}\cdot\overline{Q'_2}\cdot Q'_1\cdot\overline{I_4}=1$.

All the conditions are summarized by the logic equation:

$$D_4=Q_3+Q'_4\cdot\overline{Q_4}\cdot\overline{Q'_3}\cdot\overline{Q'_2}\cdot Q'_1$$

(c) The input $D_5$ of the converter assumes the value $Q_4$ in the general case. The transformation circuit sets $D_5$ to value 1 in case ($\gamma$), i.e. when: $Q_4\cdot Q'_4\cdot\overline{Q'_3}\cdot\overline{Q'_2}\cdot Q'_1\cdot\overline{Q_1}=1$.

All these conditions are summarized by the logic equation:

$$D_5=Q_4+Q_4\cdot\overline{Q'_4}\cdot\overline{Q'_3}\cdot\overline{Q'_2}\cdot Q'_1\cdot\overline{Q_1}$$

These logic equations are materialized by gates 94 to 114.

Finally, it should be noted that the transformation circuit of the bit stream makes it possible to take account of the introduction of the synchronization word described with reference to FIG. 6.

The invention has been described with respect to particular embodiments, but the invention is clearly not limited thereto and covers all variants thereof.

What is claimed is:

1. A process for the base band modulation of a data signal formed from a succession of bits at rate T, the modulated signal comprising a sequence of bit intervals at rate T, in which a bit of the first logic state 0 is marked by a transition at the start of a bit interval and a bit of the second logic state 1 by a transition in the center of a bit interval, wherein:
   (a) a bit is marked with the value 0 if it follows a bit not marked with the value 0 or a sequence of three consecutive bits not marked with the value 1,
   (b) a bit is marked with the value 1 if it follows a bit of value 0 or a sequence of three consecutive bits not marked with the value 1,
   (c) by exception to the rules in the above paragraphs (a) and (b), in the case where these rules lead to the marking of the first bit of a sequence 1110, called a particular sequence, formed from three bits of value 1, followed by a bit of value 0, said particular sequence is coded in the following way:
   (c1) if the bit preceding said particular seuence is a marked bit of value 0, only the third bit of value 1 of said particular sequence is marked, by a bit interval center transition, and
   (c2) if the bit preceding the first bit of said particular sequence is not a marked bit of value 0, the first bit of value 1 of this particular sequence is marked, as is the bit of value 0 of said particular sequence, each by a bit interval start transition.

2. A base band modulation apparatus for a data signal formed from a succession of bits at rate T, the modulated signal comprising a sequence of bit intervals at rate T, in which a bit of a first logic state 0 is marked by a transition at the start of a bit interval and a bit at a logic state 1, by a transition in the center of a bit interval, comprising a clock generator supplying a clock signal H of period T, whose rising fronts coincide with the start of the bit intervals of the modulated signal and a clock signal H' of period T/2 synchronized with the clock signal H; a converter supplied by the binary data signal and receiving the clock signal H, said converter supplying two binary signals $d_0$, $d_1$ respectively designating the transitions at the start and center of the bit interval; and a serialization circuit receiving the signals $d_0$, $d_1$ and the clock signals H and H' and supplying the modulated signal, wherein the converter comprises:

an elementary converter comprising a detection means for bits of value 0 and a coding means for coding the bit of the data signal following a bit of value 0 detected by the detection means, said coding means being able to code said bit according to the process, a transformation circuit for transforming the value of a bit of value 1 into value 0, prior to the coding of said bit, when one of the following conditions is satisfied:
(a) said bit is the fourth bit of a sequence of four bits of value 1, whereof only the first is marked,
(b) said bit is the second bit of the particular sequence and said particular sequence follows a marked bit of value 0,
(c) said bit is the third bit of said particular sequence and said particular sequence follows an unmarked bit of value 0.

3. An apparatus according to claim 2, wherein the elementary converter comprises a shift register formed from five bistable flip-flops in series, the first flip-flop receiving the data signal SD, a bistable flip-flop and at least one logic gate arranged so that said flip-flop indicates by a first logic state the presence of marked bit of 0 in the final flip-flop of the shift register and by the other logic state the presence of an unmarked bit of value 0 in said flip-flop and a group of logic gates for combining the signal supplied by the six flip-flops for producing transition signals $d_0$ and $d_1$.

4. An apparatus according to claim 3, wherein the transformation circuit comprises a group of logic gates setting the inputs of the second, third and fourth flip-flops of the shift register to value 1, when the transformation conditions are combined.

5. An apparatus according to claim 4, wherein it also comprises a means for inserting a synchronization word in the modulated signal.

6. An apparatus according to claim 5, wherein the synchronization word has a length of six bit intervals, said word being coded by two transitions located in the center of the first and sixth bit intervals.

7. A demodulation apparatus for producing a data signal from a received modulated signal obtained according to the process of claim 1, wherein the apparatus comprises a clock restoration circuit receiving the modulated signal and producing a clock signal H of period T, whose rising fronts coincide with the start of the bit intervals and a clock signal H' of period T/2 synchronized with the clock signal H; a deserialization circuit receiving the clock signal H' and the modulated signal and supplying a sign S indicating the presence of a transition at the start of a bit interval and a signal $S_1$ indication a transition in the center of a bit interval; and a converter receiving the signals supplied by the deserialization circuit and the clock signal H and producing a binary data signal, wherein the converter comprises:

an elementary converter for supplying a data bit of value 0, when the signal $S_0$ indicates a transition at the start of a bit interval and a data bit of value 1 when the signal $S_1$ indicates a transition in the center of the bit interval and for setting to the value 0 each data bit preceding a marked bit, a transformation circuit for transforming the state of a data bit of value 0 supplied by the elementary converter into a data bit of value 1 when one of the following conditions is satisfied:
($\alpha$) in a modulated signal, whereof the interfront is equal to 3.5T or 4T, in which said bit precedes the bit associated with the final transition of the interfront and the initial transition of the interfront is in the center of the bit interval, said bit is set to the value 1,
($\beta$) in a modulated signal, whereof the interfront is equal to 3T and whereof the initial transition is at the start of the bit interval, the three bits associated with said interfront are set to value 1,
($\gamma$) in a modulated signal, whereof the interfront is equal to 3.5T and whereof the initial transition is at the start of the bit interval, the two bits associated with the consecutive bit intervals with respect to said bit interval are set to the value 1.

8. An apparatus according to claim 7, wherein the elementary converter comprises a J-K flip-flop respectively receiving on its inputs J and K the signals $S_1$ and $S_0$, a bistable flip-flop, whose data input is connected to the output of the J-K flip-flop, another bistable flip-flop, whose data input receives a transition signal $S\phi$ supplied by an OR gate receiving the signals $S_0$ and $S_1$ an AND gate, whereof a non-inverting input is connected to the output of said flip-flop and whereof an inverting input is connected to the output of said another flip-flop, the output of said gate constituting the output of the elementary converter.

9. An apparatus according to claim 8, wherein the transformation circuit comprises a group of three bistable flip-flops forming a first four-stage shift register with said another flip-flop of the elementary converter, a group of three bistable flip-flops forming a second four-stage shift register with said flip-flop of the elementary converter and a group of logic gates for combining the signals supplied by the first shift register for setting one or more inputs of the flip-flops of the second shift register to value 1 when the transformation conditions are combined.

* * * * *